United States Patent
Takahashi et al.

(10) Patent No.: US 9,207,665 B2
(45) Date of Patent: Dec. 8, 2015

(54) HEAT TREATMENT APPARATUS AND METHOD OF CONTROLLING THE SAME

(71) Applicant: TOKYO ELECTRON LIMITED, Tokyo (JP)

(72) Inventors: Goro Takahashi, Oshu (JP); Takahito Kasai, Oshu (JP); Takanori Saito, Oshu (JP); Wenling Wang, Oshu (JP); Koji Yoshii, Oshu (JP); Tatsuya Yamaguchi, Sapporo (JP)

(73) Assignee: TOKYO ELECTRON LIMITED (JP)

( * ) Notice: Subject to any disclaimer, the term of this patent is extended or adjusted under 35 U.S.C. 154(b) by 459 days.

(21) Appl. No.: 13/742,603

(22) Filed: Jan. 16, 2013

(65) Prior Publication Data

US 2013/0204416 A1     Aug. 8, 2013

(30) Foreign Application Priority Data

Feb. 2, 2012 (JP) ................................. 2012-020811

(51) Int. Cl.
*G06F 19/00* (2011.01)
*G05B 19/418* (2006.01)
*H01L 21/67* (2006.01)

(52) U.S. Cl.
CPC ........ *G05B 19/418* (2013.01); *H01L 21/67109* (2013.01); *H01L 21/67115* (2013.01); *H01L 21/67248* (2013.01)

(58) Field of Classification Search
CPC .................................................. G05B 19/418
USPC ................................ 700/95; 705/22; 235/381
See application file for complete search history.

(56) References Cited

U.S. PATENT DOCUMENTS

| 5,517,594 A * | 5/1996 | Shah et al. ..................... 392/416 |
| 6,612,154 B1 * | 9/2003 | Blumenthal et al. ......... 73/29.01 |
| 2007/0234953 A1 * | 10/2007 | Kaushal et al. ............... 118/323 |
| 2007/0239375 A1 * | 10/2007 | Kaushal et al. ................. 702/81 |
| 2007/0259285 A1 * | 11/2007 | Kaushal et al. ............... 430/204 |
| 2009/0069949 A1 * | 3/2009 | Carpenter et al. ............ 700/283 |

FOREIGN PATENT DOCUMENTS

| JP | 2000195809 | 7/2000 |
| JP | 2002025997 | 1/2002 |
| JP | 2004164648 | 6/2004 |
| JP | 2008218558 | 9/2008 |
| JP | 2009081260 | 4/2009 |

* cited by examiner

*Primary Examiner* — Robert Fennema
*Assistant Examiner* — Anthony Whittington
(74) *Attorney, Agent, or Firm* — Cantor Colburn LLP

(57) ABSTRACT

The heat treatment apparatus that increases a temperature of a processing object and performs a heat treatment in a constant temperature, the heat treatment apparatus includes: a processing chamber which accommodates the processing object; a heating unit which heats the processing object accommodated in the processing chamber; a memory unit which stores two or more temperature control models that are previously created, a temperature controller which controls a temperature of the heating unit; and an apparatus controller which controls the temperature controller and the memory unit, wherein the apparatus controller selects a temperature control model among the two or more temperature control models according to desired heat treatment conditions, and wherein the temperature controller reads out the selected temperature control model from the memory unit to control the heating unit.

4 Claims, 8 Drawing Sheets

FIG. 4

| MODEL CHANGE CONDITION TABLE | | |
|---|---|---|
| | TEMPERATURE INCREASE PRIORITY | TEMPERATURE STABILIZATION PRIORITY |
| 100°C~200°C | Model 1 | Model 2 |
| 200°C~300°C | Model 3 | Model 4 |
| ... | ... | ... |
| A°C~A+100°C | Model A | Model A+1 |

| MODEL |
|---|
| Model 1 |
| Model 2 |
| ... |
| Model A |

INNER TEMPERATURE INFORMATION
X°C

SETTING TEMPERATURE INFORMATION
Y°C

US 9,207,665 B2

HEAT TREATMENT APPARATUS AND METHOD OF CONTROLLING THE SAME

CROSS-REFERENCE TO RELATED PATENT APPLICATIONS

This application claims the benefit of Japanese Patent Application No. 2012-020811, filed on Feb. 2, 2012, in the Japan Patent Office, the disclosure of which is incorporated herein in its entirety by reference.

BACKGROUND OF THE INVENTION

1. Field of the Invention

The present invention relates to a heat treatment apparatus and a method of controlling the same.

2. Description of the Related Art

A batch-type heat treatment apparatus is known as a heat treatment apparatus for performing a heat treatment, such as a film formation process, an oxidation process, and a diffusion process, on a semiconductor wafer.

Recently, with an increase in size of a semiconductor wafer and a decrease in process size of an integrated circuit, various heat treatments require more precise thermal control. Conditions required for thermal control performed in a batch-type heat treatment apparatus may include a ramping rate with high temperature uniformity during ramping, little overshooting of a temperature, temperature stability for achieving a target temperature in a short time, and the like.

Thermal control performed in a batch-type heat treatment apparatus is performed by one model that is previously set in a processing recipe. One model includes a plurality of sub-models according to temperature zones. The sub-models to be used are changed according to a setting temperature and an actual temperature (for example, Patent Reference 1 and Patent Reference 2).

However, since an optimum model varies according to desired heat treatment conditions, it is difficult to realize an optimum temperature characteristic by changing the model only in the temperature zones.

3. Prior Art Reference (Patent Reference 1) Japanese Laid-Open Patent Publication No. 2008-218558

(Patent Reference 2) Japanese Laid-Open Patent Publication No. 2009-81260

SUMMARY OF THE INVENTION

According to an aspect of the present invention, a heat treatment apparatus that increases or decreases a temperature of a processing object or performs a heat treatment in a constant temperature, the heat treatment apparatus including: a processing chamber which accommodates the processing object; a heating unit which heats the processing object accommodated in the processing chamber; a memory unit which stores two or more temperature control models that are previously created; a temperature controller which controls a temperature of the heating unit; and an apparatus controller which controls the temperature controller and the memory unit, wherein the apparatus controller selects a temperature control model among the two or more temperature control models according to desired heat treatment conditions, and wherein the temperature controller reads out the selected temperature control model from the memory unit to control the heating unit, Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 4 is a schematic diagram for describing a model change in a temperature-increasing step, according to an embodiment of the present invention;

DETAILED DESCRIPTION OF THE INVENTION

Figure 1:
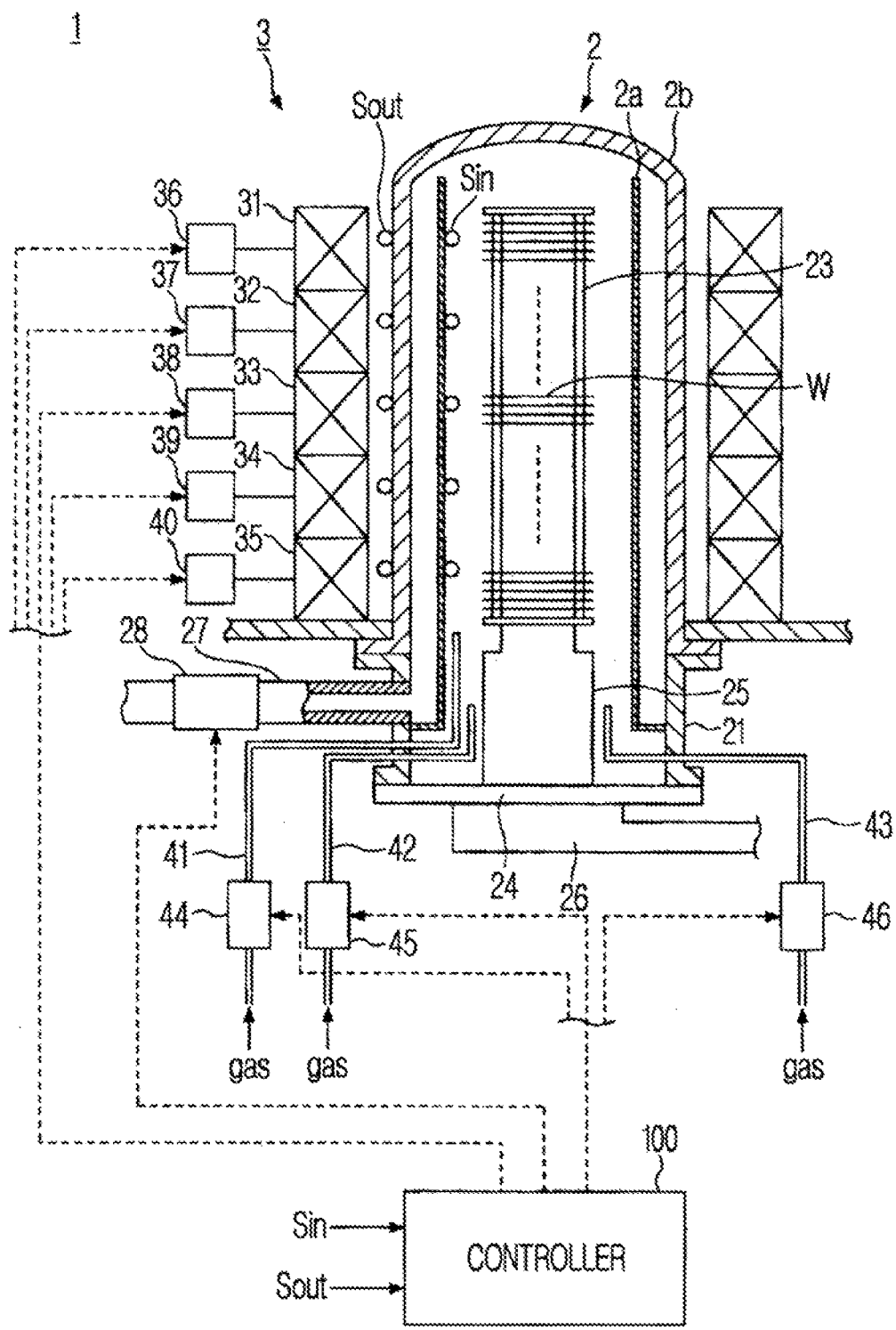
FIG. 1 is a schematic view showing a configuration of a heat treatment apparatus, according to an embodiment of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Hereinafter, the present invention will be described in detail by explaining exemplary embodiments of the invention with reference to the attached drawings.

[Heat Treatment Apparatus]

First, a configuration of a heat treatment apparatus will be described with reference to FIG. 1. FIG. 1 is a schematic view showing a configuration of the heat treatment apparatus, according to an embodiment of the present invention. However, the present invention is not limited to the configuration of the heat treatment apparatus shown in FIG. 1. The present invention may be applied to any heat treatment apparatus including a processing chamber for accommodating a processing object, a heating unit for heating the processing object accommodated in the processing chamber, a memory unit for storing two or more temperature control models that are previously created, a temperature controller for controlling a temperature of the heating unit, and an apparatus controller for controlling the temperature controller and the memory unit, and capable of performing a heat treatment method to be described later.

Although FIG. 1 shows that the heat treatment apparatus that processes a semiconductor wafer W (hereinafter, referred to as a wafer W) as the processing object, the present invention is not limited thereto.

The heat treatment apparatus 1 shown in FIG. 1 includes a reaction chamber 2 (corresponding to a processing chamber in the claims of the present invention) including an internal chamber 2a and an outer chamber 2b that are formed of, e.g., quartz, wherein the heat treatment apparatus is configured as a double-chamber. A manifold 21 formed of, e.g., a metal, and having a cylindrical shape is provided at a lower side of the reaction chamber 2. An upper end of the internal chamber 2a is opened, and the internal chamber 2a is supported by the manifold 21. The outer chamber 2b includes a ceiling, and a lower end of the outer chamber 2b is airtightly attached to the manifold 21.

A plurality of wafers W, for example, 150 wafers W, are vertically disposed in a wafer boat 23, which is a wafer support, to be parallel to one another at a predetermined interval, wherein the wafer W has a shelf shape. The wafer boat 23 is held on a cover unit 24 by a thermos vessel 25 which is a heat-insulating body.

A heater 3 (corresponding to a heating unit in the claims of the present invention) formed of, e.g., a resistant is provided around the reaction chamber 2. The heater 3 includes a plurality of heaters 31 to 35 that are disposed in a single-stage structure or a multi-stage structure, for example, a five-stage structure. A plurality of temperature controllers 36 to 40 are provided to correspond to their respective heaters 31 to 35, and the heaters 31 to 35 are independently provided with power under the control of the temperature controllers 36 to 40. Also, in the heat treatment method to be described later, an example in which a heater is configured as a single-stage structure and is controlled is described for convenience of description. However, when a plurality of heaters are configured as a multi-stage structure, the heat treatment method may be used with respect to each of the heaters.

A gas supply pipe for supplying a gas, e.g., a processing gas, into the internal chamber 2a is provided in the manifold 21. Although three gas supply pipes 41 to 43 are shown in FIG. 1, a number of the gas supply pipes may vary according to, for example, desired heat treatment conditions. A gas is supplied to the gas supply pipes 41 to 43 via a plurality of flow rate controllers 44 to 46, for example, a mass flow controller (MFC). Also, the types of processing gases may be appropriately selected by one of ordinary skill in the art according to desired heat treatment conditions.

Also, an exhaust pipe 27 is connected to the manifold 21 so as to exhaust air from a gap between the internal chamber 2a and the outer chamber 2. The exhaust pipe 27 is connected to, for example, a vacuum pump (not shown). A pressure controller 28 for controlling pressure in the reaction chamber 2 is provided in the exhaust pipe 27, wherein the pressure controller 28 includes a combination valve, a butterfly valve, a valve driving unit, and the like.

A plurality of thermocouples $S_{in}$, for example, five thermocouples $S_{in}$, are disposed on an inner surface of the internal chamber 2a in a vertical direction. The thermocouple $S_{in}$ may be protected by, for example, a quartz pipe to prevent a metal pollution of the wafer W.

A plurality of thermocouples $S_{out}$, for example, five thermocouples $S_{out}$, are disposed on an outer surface of the outer chamber 2b in a vertical direction.

The heat treatment apparatus 1 according to an embodiment of the present invention includes an apparatus controller 100 for controlling at least the temperature controllers 36 to 40 and the heater 3. Also, the apparatus controller 100 receives signals detected by the thermocouple $S_{in}$ and the thermocouple $S_{out}$ and outputs a control signal to the temperature controllers 36 to 40, the pressure controller 28, and the flow rate controllers 44 to 46 Accordingly, the apparatus controller 100 may control processing parameters such as a temperature of a processing atmosphere, gas flow rate, or pressure in the reaction chamber 2.

[Method of Controlling Heat Treatment Apparatus]

Figure 2:
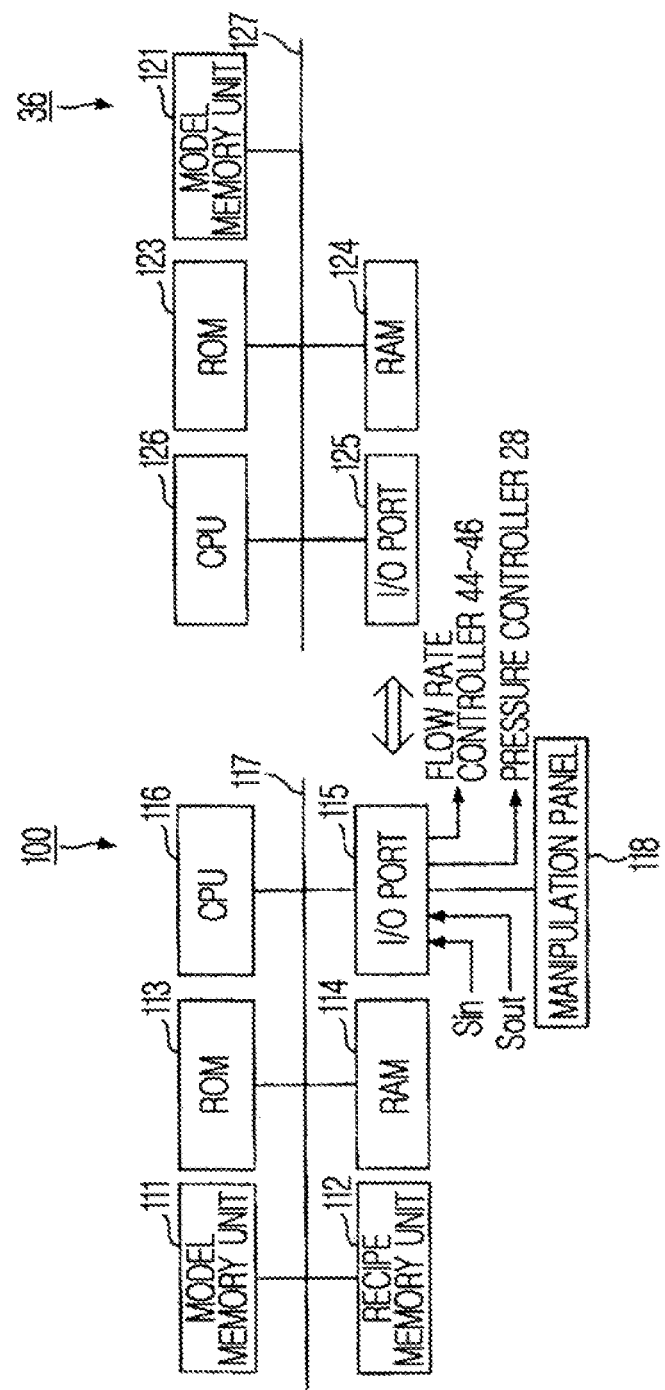
FIG. 2 is a schematic diagram for describing configurations of an apparatus controller and a temperature controller, according to an embodiment of the present invention.

Next, a method of controlling the heat treatment apparatus 1 will be described with reference to FIG. 2 by describing configurations of the apparatus controller 100 and the temperature controller 36. FIG. 2 is a schematic diagram for describing configurations of the apparatus controller 100 and the temperature controller 36, according to an embodiment of the present invention. Although only the temperature controller 36 will be described in FIG. 2 for convenience of description, even in a case where a plurality of temperature controllers are disposed, the temperature controllers may have the same configuration.

As shown in FIG. 2, the apparatus controller 100 includes a model memory unit 111, a recipe memory unit 112, a ROM 113, a RAM 114, an I/O port 115, a CPU 116, and a bus 117 for connecting the above-mentioned components to one another. Also, the temperature controller 36 includes a model memory unit 121, a ROM 123, a RAM 124, an I10 port 125, a CPU 126, and a bus 127 for connecting the above-mentioned components to one another. Although the apparatus controller 100 and the temperature controller 36 shown in FIG. 2 are connected to each other via the I/O ports 115 and 125, the apparatus controller 100 and the temperature controller 36 may be connected to each other via another electrical communication circuit.

The model memory unit 111 stores at least two models (mathematical model; high- and multi-dimensional functions) that are designed to command current to be applied to the heaters 31 to 35, based on output signals regarding temperatures measured by the thermocouples $S_{in}$ and $S_{out}$. The model may be designed to estimate a temperature of the wafer W mounted on the wafer boat 23 from the output signals regarding the temperatures measured by the thermocouples $S_{in}$ and $S_{out}$ and to set the estimated temperature as a target value, or may be designed to set the output signal of the thermocouple $S_{in}$ (and/or the thermocouple $S_{out}$) as a target value. Also, a method of designing the model will be described later.

The recipe memory unit 112 stores a plurality of types of recipes for determining the order of control according to a heat treatment performed in the heat treatment apparatus 1. In general, according to characteristics of an individual heat treatment apparatus, the inside of the reaction chamber 2 may be divided into a plurality of zones in a direction in which the wafers W are arranged as shown in FIG. 1, and an adjusted recipe is prepared in each of the zones so that a heat treatment may be uniformly performed between surfaces and in the surface (for example, so that a film thickness becomes uniform in a film formation process). The adjusted recipe may be appropriately adjusted by one of ordinary skill in the art in consideration of non-uniformity of a film thickness due to other factors, for example, a difference in gas flow rate. Also, each of the recipes generally includes a temperature recipe.

The ROMs 113 and 123 are configured as an EEPROM, a flash memory, a hard disk, or the like, and are storage mediums for storing operation programs of the CPUs 116 and 126.

The RAMs 114 and 124 serve as, for example. work areas of the CPUs 116 and 126. The I/O port 115 supplies signals measured by the thermocouples $S_{in}$ and $S_{out}$ to the CPU 116 and outputs a control signal output from the CPU 116 to components (for example, the temperature controller 36). Also, manipulation panels 118 and 128 may be connected to the I/O ports 115 and 125. respectively, The buses 117 and 127 transmit information between the components.

In the method of controlling the heat treatment apparatus according to the current embodiment, first, two or more models are previously designed, and then the models are stored in the model memory unit 111. Although the method of designing the models will be described later, two or more models may be made according to steps of a heat treatment (a temperature increasing step, a temperature decreasing step, a temperature recovering step, or a temperature stabilizing step); the types of processes (temperature, pressure, or a gas flow rate); a layout of the wafer (a number of processed wafers W and arrangement of the wafers W); the types of gases in the film formation process; a loading speed or the location of the wafer boat when carrying the wafers into the reaction chamber 2; and an accumulated film thickness.

After the recipe is determined, the apparatus controller 100 selects appropriate models corresponding to steps of the recipe, among the models stored in the model memory unit 111. The temperature controller 36 downloads the selected models via the I/O port and stores the selected models in the model memory unit 121.

The CPU 116 of the apparatus controller 100 executes a control program, which is stored in the ROM 113, regarding the heat treatment apparatus control method to be described later, and controls operations of the temperature controller 36 (and the heater 3) according to the recipe stored in the recipe memory unit 112 according to an instruction of the manipulation panel 118. in detail, the CPU 116 selects and reads out a corresponding one from the plurality of recipes stored in the recipe memory unit 112. Then, the CPU 126 selects and downloads a corresponding one among the plurality of models stored in the model memory unit 111 according to the selected recipe, and stores the corresponding one in the model memory unit 121. The CPU 116 executes a processing operation according to the recipe. Here, the CPU 116 receives values measured by the thermocouples $S_{in}$ and $S_{out}$, estimates a temperature of the wafer minute by minute, and controls the temperature controller 36 (and the temperature controllers 37 to 40) so that a value indicated by a temperature recipe included in the selected recipe corresponds to the estimated temperature of the wafer.

Although, here, a heat treatment is performed on the recipe that is previously created, a user may input, via the manipulation panel 118 (or the manipulation panel 123), conditions, for example, steps of the heat treatment (a temperature increasing step, a temperature decreasing step, a temperature recovering step, or a temperature stabilizing step); the types of processes (temperature, pressure, or a gas flow rate); a layout of the wafer (a number of processed wafers W and arrangement of the wafers W); the types of gases in the film formation process; a loading speed or the location of the wafer boat when carrying the wafers into the reaction chamber 2; and an accumulated film thickness, and the apparatus controller 100 may select an optimum model with respect to the conditions input by the user.

In the heat treatment apparatus according to the current embodiment, a plurality of models are previously prepared in the apparatus controller 100 according to steps of a heat treatment (a temperature increasing step, a temperature decreasing step, a temperature recovering step, or a temperature stabilizing step); the types of processes (temperature, pressure, or a gas flow rate); a layout of the wafer (a number of processed wafers W and arrangement of the wafers W); the types of gases in the film formation process; a loading speed or the location of the wafer boat when carrying the wafers into the reaction chamber 2; and an accumulated film thickness, and the temperature controller 36 may download an optimum model. Accordingly, the apparatus controller 100 may appropriately perform a heat treatment (for example, a film-formation process) by adaptive control according to the recipe. Thus, the heat treatment apparatus of the present invention may perform the heat treatment with the optimum model according to various conditions, for example, steps of a heat treatment (a temperature increasing step, a temperature decreasing step, a temperature recovering step, or a temperature stabilizing step): the types of processes (temperature, pressure, or a gas flow rate); a layout of the wafer (a number of processed wafers W and arrangement of the wafers W); the types of gases in the film formation process; a loading speed or the location of the wafer boat when carrying the wafers into the reaction chamber 2; and an accumulated film thickness.

Also, in the heat treatment apparatus for forming the film-formation process, in general, as a number of processes increases, a thickness of a film attached to an inner wall surface of a furnace is accumulated. In other words, even when a temperature control is performed under the same process film-formation thickness condition, as an accumulated film thickness increases, a temperature in the furnace decreases. Thus, uniformity between batches may be decreased. Accordingly, in the heat treatment apparatus of the present invention, the ROM 113 or 123 may be configured to store the accumulated film thickness attached to the inner wall surface of the furnace and a relationship between a film thickness and a temperature. Therefore, the temperature controller may download the optimum model from the model memory unit 111 according to the accumulated film thickness to perform the film formation process. Accordingly, even when a number of batch processing is increased, and thus the film thickness attached to the inner wall surface of the furnace is accumulated, a film may be successfully formed in a surface of the wafer. Also, uniformity of the wafers W in each of batches and each of cassettes may be improved. In addition, information regarding the accumulated film thickness may be obtained by previously storing a relationship between the film thickness attached to the inner wall surface of the furnace and a corrected temperature and accumulating the film thickness to be attached by the recipe according to the progress of the recipe. The apparatus controller controls the heater based on the accumulated film thickness and the corrected temperature. The accumulated film thickness may be obtained by using a method of storing the film thickness to be attached by each recipe and adding the film thickness in every progress of each recipe, or a method of performing a heat treatment by previously using a dummy wafer and estimating the accumulated film thickness by measuring the film thickness.

The CPU 116 also performs instructions to the flow rate controllers 44 to 46 and to the pressure controller 28 similar to a method of controlling a general heat treatment apparatus.

In the heat treatment apparatus of the present invention, the temperature controllers may download an optimum model according to various process conditions or the accumulated film thickness, among the plurality of models stored in the apparatus controller to perform a process. Thus, even when a dummy wafer is not used, a temperature of each wafer W may be appropriately controlled. Also, even when the dummy wafer is used, a number of expensive dummy wafers, which are to be used, may be reduced compared to a conventional heat treatment apparatus. Accordingly, a heat treatment may be stably performed regardless of the process conditions or the accumulated film thickness.

In the current embodiment, although a case where one temperature controller exists has been described for convenience of description, the recipe may be adjusted in each of a plurality of zones so that the heat treatment may be uniformly performed between surfaces and in the surface.

[Method of Designing Model and Recipe]

Next, a method of designing models and recipes will be described. The model may be any arbitrary mathematical model (multi-variable, multi-dimensional, and multi-output functions) that may specify power to be supplied to the heater in order to estimate a temperature of the wafer W from, e.g., the outputs of the thermocouples $S_{in}$ and $S_{out}$ (that is, values measured by the thermocouples $S_{in}$ and $S_{out}$) and power to be supplied to the heater (the heaters 31 to 35 shown in FIG. 1) and to allow the estimated temperature of the wafer W to be proximity to the target temperature. Specifically, for example, a model disclosed in U.S. Pat. No. 5,517,594 may be used.

Figure 3A:
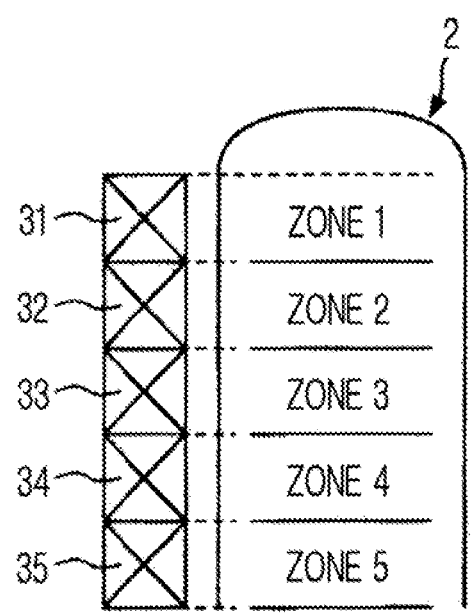
FIG. 3A is a diagram for describing a model and shows zones in a reaction pipe, according to an embodiment of the present invention.
Figure 3B:
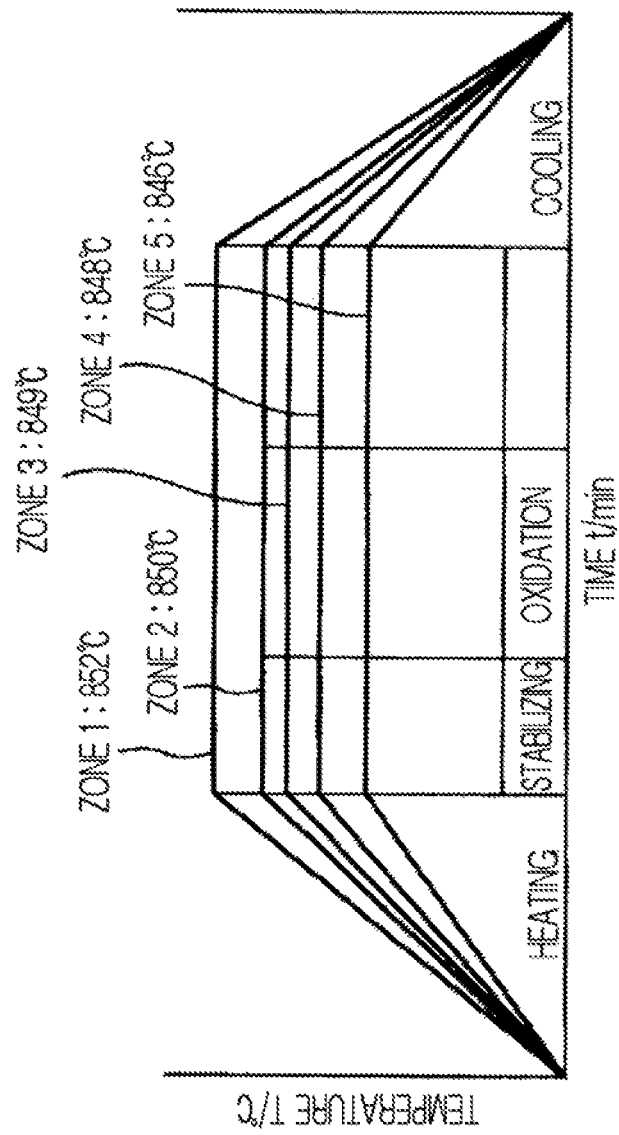
FIG. 3B is a view for describing a model and shows target temperature orbits according to zones, according to an embodiment of the present invention.

Hereinafter, although the model disclosed in U.S. Pat. No. 5,517,594 will be described as an example, the present invention is not limited to a method of designing the model. FIG. 3A is a diagram for describing a model and shows zones in the reaction chamber, and FIG. 3B is a view for describing a model and shows target temperature orbits according to zones.

First, five test wafers are prepared in the heat treatment apparatus 1 shown in FIG. 1, wherein a thermocouple $S_{wc}$, which is located at center of the test wafer, and a thermocouple $S_{we}$, which is separated from the center of the test wafer by, e.g., 6 mm are incorporated in the test wafer. Next, the test wafers and general wafers are mounted on the wafer boat 23 so that the five test wafers are respectively located in five zones shown in FIG. 3A. Then, the wafer boat 23 is loaded into the reaction chamber 2. Next, signals of a high-frequency band and a low-frequency band are applied to the heater 31 to 35 to obtain data, for example, outputs of the thermocouples $S_{in}$ and $S_{out}$, outputs (temperatures of the wafers W) of the thermocouples and $S_{wc}$ and $S_{we}$ the test wafer, and current applied to the heater, at a sampling period of, e.g., about 1 to 5 seconds.

Next, temperature bands are set in a predetermined temperature range, for example, between about 400° C. and 1000° C., at an interval of 100° C. An ARX (Automated Regression) model, shown by Equation 1, is set with respect to each of temperature bands by using the obtained data.

$$y_t + AA_1 y_{t-1} + AA_2 y_{t-n} + \ldots , + AA_n y_{t-n} = BB_1 u_{t-1} + BB_2 u_{t-2} + \ldots + BB_n u_{t-n} + e_t \quad \text{[Equation 1]}$$

In Equation 1, $y_t$ denotes matters of a vector of p-th column and 1st-row consisting of matters below at a time point t: variations of the output of the thermocouple $S_{in}$ (here, 5 components because five thermocouples $S_{in}$ exist), variations of the output of the thermocouple $S_{out}$ (here, 5 components because five thermocouples $S_{out}$ exist), variations of the output of the thermocouple $S_{wc}$ set in a center portion of the wafer (here, five), variations of the output of the thermocouple $S_{we}$ set in a peripheral portion of the wafer (here, five). Thus, $y_t$ is a vector of 20th column and 1st row.

Also, in Equation 1, $u_t$: a vector of m-th column and 1st row consisting of variations of power of the heater at a time point t (here, 5th column and 1st row because five heaters exist);

$e_t$: a vector of m-th column and 1st row consisting of white noise;

n: a delay (for example, 8);

$AA_1$ to $AA_n$: a matrix of p-th column and p-th row (here, 20th column and 20th row);

$BB_1$ to $BB_n$: a matrix of p-th column and m-th row (here, 20th column and 5th row), wherein, coefficients $AA_1$ to $AA_n$ and $BB_1$ to $BB_n$ are determined by using a method of least squares.

If a relationship of the ARX model is applied to a state space method, a basic equation thereof is given as shown in Equation 2 below.

$$x_{t-1} A x_t + B u_t + K_e e_t y_t = C x_{t-1} + e_t \quad \text{[Equation 2]}$$

In Equation 2, x denotes a state variable, K denotes a feedback gain of a Kalman filter, and A, B, and C denote matrices.

In order to improve a processing speed during an actual film formation, an order is generally decreased to about 10th dimension, and mathematical model is made for each temperature band by using Equation 2.

Thus, Equation 3 in which the temperature of the wafer is induced may be induced at each temperature band by using inputs (the thermocouple $S_{in}$, the thermocouple $S_{out}$, and power P supplied to the heater).

$$x^{t+1} = Ax^t + B(P \text{ input}, t+u \text{ bias}) + L(T \text{ thermocouple}, t-Csx^t+S \text{ bias}) \, T \text{ model}, t=Cwx^t+W \text{ bias} \quad \text{[Equation 3]}$$

Next, the test wafer is processed again, the model is tuned by comparing a wafer temperature Tmodel and an actual measurement value Twafer that are estimated based on Equation 3, A tuning operation is repeated a plurality of times when necessary.

Meanwhile, regarding the operation program of the CPU 116, an operation is set to minimize a time average of variations in the temperature of the wafer W estimated from a setting value of a temperature.

Also, a temperature target orbit Ttraj(t), that is, the temperature recipe, in which film formation may be uniformly performed in each zone, is designed according to the types of film formation process. Then, all the five zones are controlled to follow up the temperature target orbit Ttraj(t), and thus a film formation process is performed as a test. After the film formation process, a thickness of a formed film is measured to check non-uniformity of the film thickness, etc. For example, if the film thickness of the wafer W at an upper end is smaller than the film thickness of the wafer W at a lower end, even though a direct reason is unclear, the film thicknesses of the wafers at the upper and lower ends may be nearly equal to each other by relatively increasing a temperature of the upper end. Thus, the temperature target orbit Ttraj(t) is corrected so as to minimize the non-uniformity of the film thickness by using a method of least squares.

As described above, by performing evaluation by using an actual equipment of the heat treatment apparatus according to the current embodiment, the model for estimating the temperature of the wafer and defining an output for setting the temperature of the wafer W to a target temperature, and the recipe are set and are respectively stored in the model memory unit 111 and the recipe memory unit 112.

Also, here, the method of designing an optimum model according to the layout of the wafer W (a number of processed wafers W and arrangement of the wafers W) has been described. However, the optimum model may vary according to steps of a heat treatment (a temperature increasing step, a temperature decreasing step, a temperature recovering step, or a temperature stabilizing step); the types of processes (temperature, pressure, or a gas flow rate); a layout of the wafer (a number of processed wafers W and arrangement of the wafers W); the types of gases in the film formation process; a loading speed or the location of the wafer boat when carrying the wafers into the reaction chamber 2; an accumulated film thickness, and the like. Thus, a plurality of models may be previously created by using the above-described method according to the above-described parameters, and evaluation may be performed on the models by using an actual equipment of the heat treatment apparatus according to the current embodiment, and then the models may be stored in the model memory unit 111 of the apparatus controller 100. Thus, since the temperature controller 36 may download the optimum model from the model memory unit 111 according to a desired recipe to perform a process, a heat treatment may be stably performed regardless of process conditions and an accumulated film thickness.

Also, the made models may be classified into temperature increase-priority models and stabilization-priority models according to characteristics of the models and may be stored in the model memory unit 111 Specifically, a made basic model is evaluated by using a recipe including a temperature-increasing step, parameters (the coefficients $AA_1$ to $AA_n$ and $BB_1$ to $BB_n$) of the model is adjusted (that is, the model is tuned) with reference to temperature control characteristics during a temperature increase, and thus the obtained model is set to the temperature increase-priority model. Also, the made basic model is evaluated by using a recipe including a temperature stabilizing step, and parameters of the model are tuned with reference to temperature control characteristics during stabilization, and thus the obtained model is set to the stabilization-priority model. Also, a method of tuning the model is the same as the above-described method.

In addition, in the above-describe embodiment, although an example of designing the model, in which the temperature of the wafer W mounted on the wafer boat 23 is estimated from the output signals regarding the temperatures measured by the thermocouples $S_{in}$ and $S_{out}$ and the estimated temperature is set to a target value, has been described, the model may be designed in such a way that the output signal of the thermocouple $S_{in}$ (and/or thermocouple $S_{out}$) is set to a target value.

[First Embodiment]

Next, a first embodiment of the present invention will be described. As described above, in the method of controlling the heat treatment apparatus of the present invention, an optimum model may vary according to steps of a heat treatment (a temperature increasing step, a temperature decreasing step, a temperature recovering step, or a temperature stabilizing step); the types of processes (temperature, pressure, or a gas flow rate); a layout of the wafer (a number of processed wafers and arrangement of the wafers); the types of gases in the film formation process; a loading speed or the location of the wafer boat when carrying the wafers into the reaction chamber 2; an accumulated film thickness, and the like. Accordingly, in the current embodiment, an example of changing the model according to steps of a heat treatment (a temperature-increasing step of increasing a temperature from a first setting temperature to a second setting temperature) will be described.

FIG. 4 is a schematic diagram for a model change in a temperature-increasing step, according to an embodiment of the present invention. The model memory unit 111 of the apparatus controller 100 previously stores two or more models. Also, the ROM 113 of the apparatus controller 100 stores a condition table of a model change. For example, as shown in FIG. 4, as the condition table, at least a temperature increase-priority model and a stabilization-priority model are set with respect to a certain temperature region, Although FIG. 4 shows an embodiment in which a width of the temperature region of the condition table is 100° C., the present invention is not limited thereto.

The ROM 113 (or the ROM 123) of the apparatus controller 100 (or the temperature controller 36) stores information regarding a temperature in the reaction chamber 2 or a log of the information that are estimated by using the above-described model designing method. Also, the ROM 113 (or the ROM 123) of the apparatus controller 100 (or the temperature controller 36) stores information regarding a setting temperature.

The apparatus controller 100 selects a model to be used based on the condition table of the model change, the information regarding the temperature the reaction chamber 2, and the information regarding the setting temperature.

The temperature controller 36 downloads the selected model to perform temperature control.

Using one of the temperature increase-priority model and the stabilization-priority model may be determined according to whether an absolute value of a difference between a temperature value of the information regarding the setting temperature and a temperature value of the information regarding the temperature in the reaction chamber 2 exceeds a predetermined threshold value. Specifically, if the absolute value of the difference between the temperature value of the information regarding the setting temperature and the temperature value of the information regarding the temperature in the reaction chamber 2 exceeds the predetermined threshold value, the temperature increase-priority model is determined to be used, and if the absolute value of the difference between the temperature value of the information regarding the setting temperature and the temperature value of the information regarding the temperature in the reaction chamber 2 is equal to or less than the predetermined threshold value, the stabilization-priority model is determined to be used.

Figure 5:
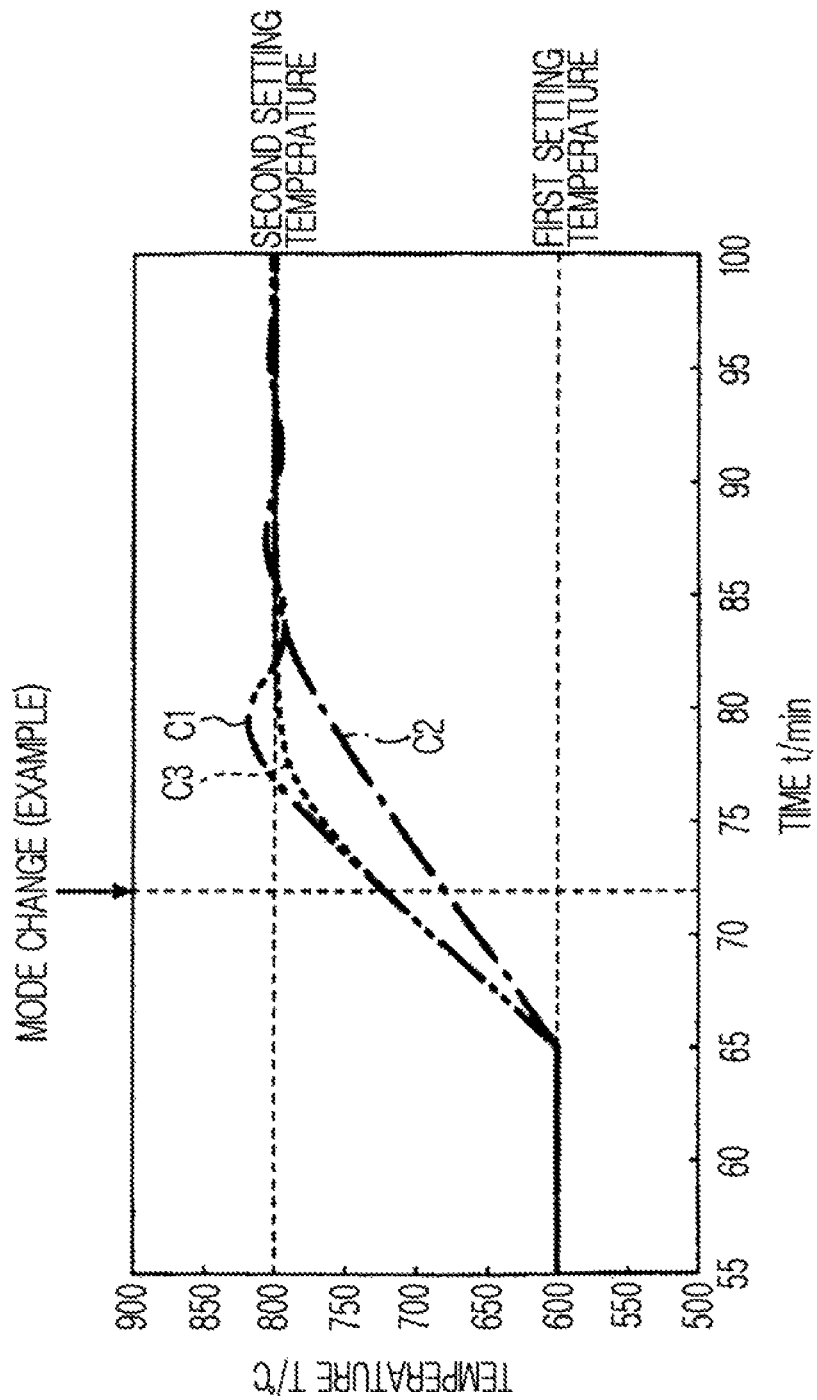
FIG. 5 is a schematic graph for describing a model change in a temperature-increasing step, according to an embodiment of the present invention.

Hereinafter, a detailed example will be described with reference to FIG. 5. FIG. 5 is a schematic graph for describing a model change in the temperature-increasing step. In FIG. 5, a vertical axis indicates a temperature, and a horizontal axis indicates time.

In FIG. 5, a curve C1 shows a temperature orbit when only the temperature increase-priority model is used when a temperature is increased from the first setting temperature to the second setting temperature. When only the temperature increase-priority model is used, a temperature characteristic with a following property is obtained with respect to the setting temperature. However, overshooting occurs after the temperature increase, and thus it requires longer time to stabilize the temperature to the second setting temperature.

Meanwhile, in FIG. 5, a curve C2 shows a temperature orbit when only the stabilization-priority model is used when a temperature is increased from the first setting temperature to the second setting temperature. When only the stabilization-priority model is used, a temperature characteristic with stability after the temperature increase is obtained. However, a temperature characteristic with a low following property is obtained with respect to the setting temperature during the temperature increase (that is, it requires longer time to increase the temperature).

In the embodiment of the present invention, an optimum model may be selected among two or more temperature control models that are previously created so that the temperature increase-priority model is changed to the stabilization-priority model at a predetermined time point (in FIG. 5, at a time point t corresponding to 72) during the temperature increase, thereby performing a heat treatment. Thus, both a temperature characteristic with a following property during the temperature increase and a temperature characteristic with stability after the temperature increase may be achieved.

[Second Embodiment]

Next, a second embodiment of the present invention will be described. In the current embodiment, an example of changing the model according to an accumulated film thickness will be described.

Figure 6:
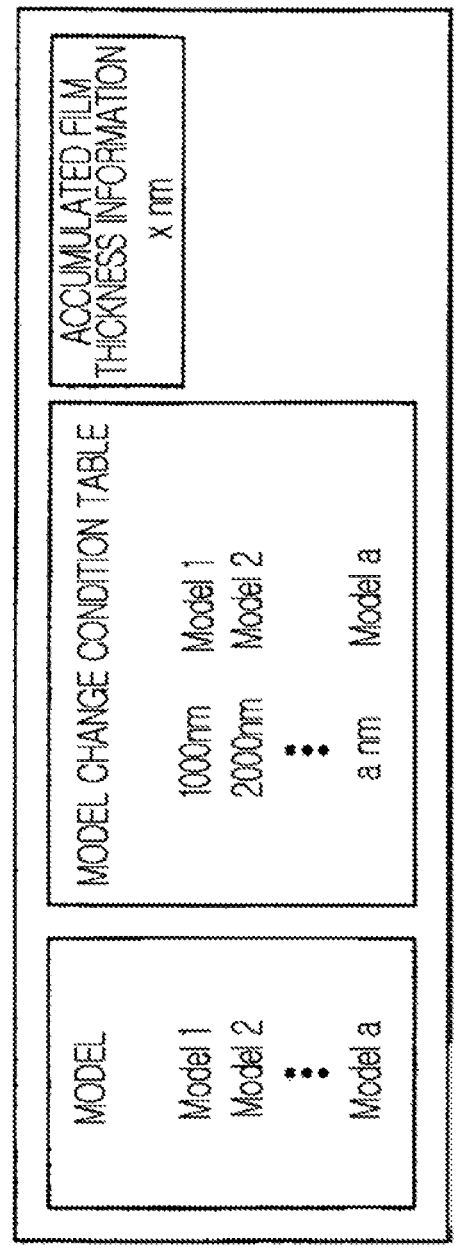
FIG. 6 is a schematic diagram for describing a model change based on an accumulated film thickness, according to an embodiment of the present invention.

FIG. 6 is a schematic diagram for a model change based on an accumulated film thickness, according to an embodiment of the present invention. The model memory unit 111 of the apparatus controller 100 previously stores two or more models, Also, the ROM 113 of the apparatus controller 100 stores a condition table of a model change.

In addition, the ROM 113 (or the ROM 123) of the apparatus controller 100 (or the temperature controller 36) stores information regarding the accumulated film thickness in the reaction chamber 2.

The apparatus controller 100 selects a model to be used based on the condition table of the model change and the accumulated film thickness. Specifically, when the current accumulated film thickness is 2200 nm, a model (in FIG. 6, Model 2) having the accumulated film thickness of 2000 nm which is proximate to a film thickness in the condition table of the model change shown in FIG. 6 is selected.

The temperature controller 36 downloads the selected model to perform temperature control.

Figure 7:
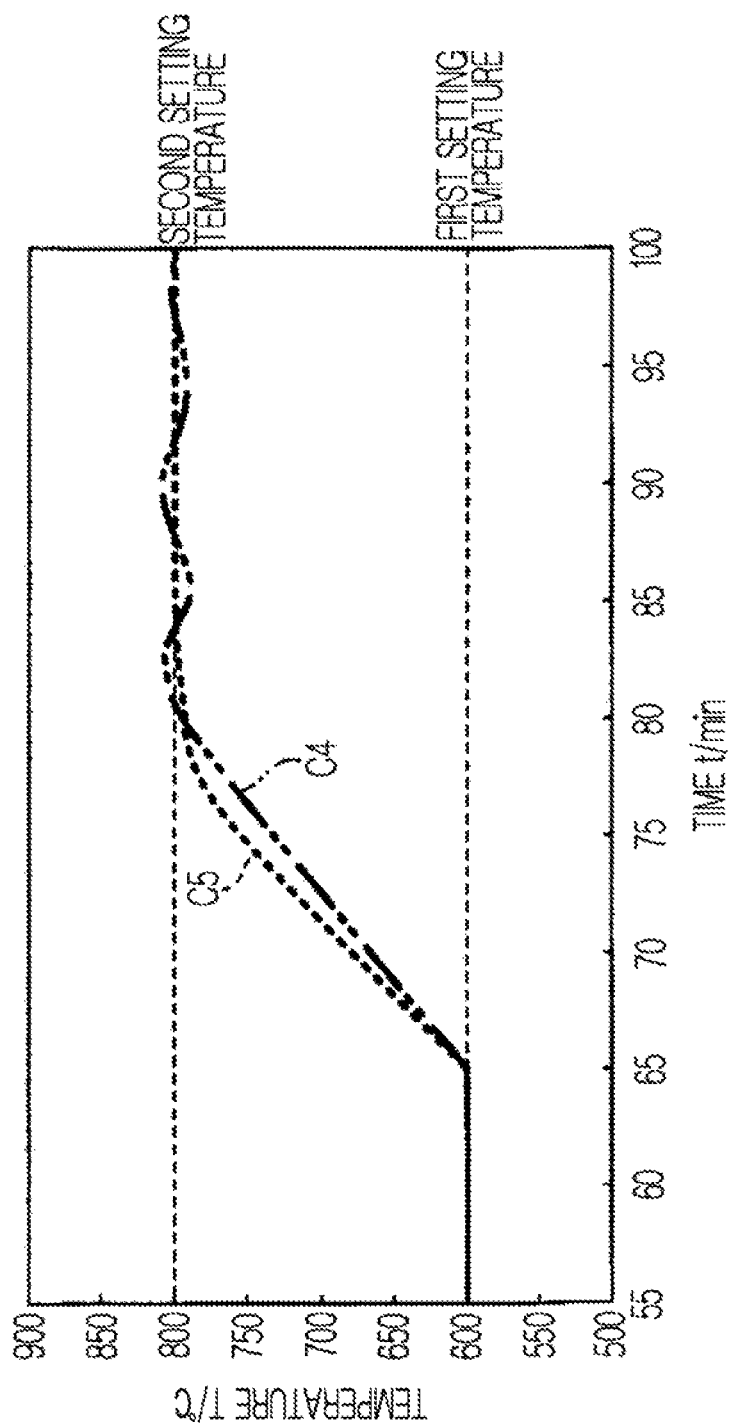
FIG. 7 is a schematic graph for describing selecting a proper model based on an accumulated film thickness, according to an embodiment of the present invention.

Hereinafter, a detailed example will be described with reference to FIG. 7, FIG. 7 is a schematic graph for describing selecting a proper model based on the accumulated film thickness, according to an embodiment of the present invention. in FIG. 7, a vertical axis indicates a temperature, and a horizontal axis indicates time. FIG. 7 shows a temperature control characteristic when the accumulated film thickness is 3000 nm.

In FIG. 7, a curve C4 shows a temperature control characteristic when a tuned model is used on the assumption that the accumulated film thickness is 1000 nm. In this example where the model used in a small accumulated film thickness is used in a large accumulated film thickness, a thermal conduction time is different from an assumed conduction time, and thus vibration is generated.

Meanwhile, a curve C5 shows a temperature control characteristic when a tuned model is used on the assumption that the accumulated film thickness is 3000 nm. In this case, since the accumulated film thickness assumed when designing the model and an actual accumulated film thickness are the same, an ideal temperature control characteristic may be obtained.

In the embodiment of the present invention, even when the accumulated film thickness is changed, an optimum model may be selected among two or more temperature control models that are previously created to perform a heat treatment. Accordingly, a number of batch processes is increased, and thus even though a film thickness attached to an inner wall surface of a furnace is accumulated, the heat treatment may be uniformly performed between surfaces and in the surface.

In a heat treatment apparatus of the present invention, a temperature controller may download an optimum model, selected among a plurality of models stored in an apparatus controller, according to various process conditions and an accumulated film thickness to perform a heat treatment. Accordingly, the heat treatment may be stably performed regardless of the various process conditions and the accumulated film thickness.

According to the present invention, a heat treatment apparatus capable of realizing an optimum temperature characteristic according to desired heat treatment conditions may be provided.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A heat treatment apparatus that increases or decreases a temperature of a processing object to a setting temperature, the heat treatment apparatus comprising:
   a processing chamber which accommodates the processing object;
   a heating unit which heats the processing object accommodated in the processing chamber;
   a memory unit which stores two or more temperature control models that are previously created;
   a temperature controller which controls a temperature of the heating unit; and
   an apparatus controller which controls the temperature controller and the memory unit,
   wherein the apparatus controller is configured: to select, among the stored two or more temperature control models, a first temperature control model capable of increasing or decreasing the temperature of the processing object more rapidly than other stored temperature control models, and, in the middle of temperature increase or temperature decrease of the processing object, to switch the selected temperature control model to a second temperature control model among the stored two or more temperature control models, the second temperature control model being capable of more stably converging the temperature of the processing object to the setting temperature than other stored temperature control models, and
   wherein the temperature controller reads out the selected temperature control model from the memory unit to control the heating unit.

2. A heat treatment apparatus that increases or decreases a temperature of a processing object or performs a heat treatment in a constant temperature, the heat treatment apparatus comprising:
   a processing chamber which accommodates the processing object;
   a heating unit which heats the processing object accommodated in the processing chamber;
   a memory unit which stores two or more temperature control models that are previously created;
   a temperature controller which controls a temperature of the heating unit; and
   an apparatus controller which controls the temperature controller and the memory unit,
   wherein the apparatus controller is configured to select the temperature control model among the two or more temperature control models according to a thickness of a film accumulated on an inner wall surface of the processing chamber.

3. A method of controlling a heat treatment apparatus that comprises a processing chamber which accommodates the processing object; a heating unit which heats the processing object; a memory unit which stores two or more temperature control models that are previously created; a temperature controller which controls a temperature of the heating unit by reading out the temperature control model stored in the memory unit; and an apparatus controller which controls the temperature controller and the memory unit, to increase or decrease a temperature of the processing object to a setting temperature, the method comprising:

selecting, among the stored two or more temperature control models, a first temperature control model capable of increasing or decreasing the temperature of the processing object more rapidly than other stored temperature control models;

controlling the heating unit by reading out the first temperature control model from the memory unit;

in the middle of temperature increase or temperature decrease of the processing object, switching the first temperature control model to a second temperature control model among the stored two or more temperature control models, the second temperature control model being capable of more stably converging the temperature of the processing object to the setting temperature than other stored temperature control models; and controlling the heating unit by reading out the second temperature control model from the memory unit.

4. A method of controlling a heat treatment apparatus that comprises a processing chamber which accommodates the processing object; a heating unit which heats the processing object; a memory unit which stores two or more temperature control models that are previously created; a temperature controller which controls a temperature of the heating unit by reading out the temperature control model stored in the memory unit; and an apparatus controller which controls the temperature controller and the memory unit, the method comprising:

selecting the temperature control model among the two or more temperature control models according to desired heat treatment conditions; and controlling the heating unit by reading out the selected temperature control model from the memory unit, wherein the selecting of the temperature control model comprises selecting the temperature control model among the two or more temperature control models according to a thickness of a film accumulated on an inner wall surface of the processing chamber.

* * * * *